United States Patent
Young

(10) Patent No.: US 7,509,617 B1
(45) Date of Patent: Mar. 24, 2009

(54) DESIGN METHODOLOGY TO SUPPORT RELOCATABLE BIT STREAMS FOR DYNAMIC PARTIAL RECONFIGURATION OF FPGAS TO REDUCE BIT STREAM MEMORY REQUIREMENTS

(75) Inventor: Jay T. Young, Loisville, CO (US)

(73) Assignee: XILINX, Inc., San Jose, CA (US)

( * ) Notice: Subject to any disclaimer, the term of this patent is extended or adjusted under 35 U.S.C. 154(b) by 239 days.

(21) Appl. No.: 11/225,248

(22) Filed: Sep. 12, 2005

(51) Int. Cl.
*G06F 17/50* (2006.01)

(52) U.S. Cl. .................................................. 716/16

(58) Field of Classification Search ............... 716/1–18
See application file for complete search history.

(56) References Cited

U.S. PATENT DOCUMENTS

| | | | |
|---|---|---|---|
| 6,173,434 B1 * | 1/2001 | Wirthlin et al. | 716/17 |
| 6,462,579 B1 | 10/2002 | Camilerri et al. | |
| 6,678,646 B1 * | 1/2004 | McConnell et al. | 703/22 |
| 6,817,005 B2 | 11/2004 | Mason et al. | |
| 2002/0010852 A1 * | 1/2002 | Arnold et al. | 713/1 |

OTHER PUBLICATIONS

Horta et al., Dynamic Hardware Plugins in an FPGA with Partial Run-Time Reconfiguration, 39th Design Automation Conference, Jun. 2002.*

Horta et al., PARBIT: A Tool to Transform Bitfiles to Implement Partial Reconfiguration to Field Programmable Gate Arrays (FPGAs), Washington University, Department of Computer Science, Technical Report WUCS-01-13, Jul. 2001.*

Kalte et al., System-on-programmable-chip Approach Enabling Online Fine-Grained 1D-Placement, Proceedings of the 18th International Parallel and Distributed Processing Symposium, Apr. 2004.*

U.S. Appl. No. 11/126,130, filed May 10, 2005, Becker et al.

U.S. Appl. No. 11/238,433, filed Sep. 28, 2005, Mason, Jeffrey M., et al., entitled "Method and Apparatus for Modular Circuit Design for a Programmable Logic Device", Xilinx, Inc. 2001 Logic Drive, San Jose, California, 95124.

* cited by examiner

*Primary Examiner*—Vuthe Siek
*Assistant Examiner*—Aric Lin
(74) *Attorney, Agent, or Firm*—Thomas A. Ward; Kevin T. Cuenot

(57) ABSTRACT

A method for generating a design for an FPGA provides for partial reconfiguration by allowing relocation of the same single bitstream within different areas of the FPGA, reducing overall design time and PROM storage space needed for the design. The design rules for the method include a requirement that the same frames oriented in the same relative location be available in dynamic areas where a bit stream will be located. Further, the rules require the same relative communication interfaces be available between the dynamic areas and static areas when the bit stream is relocated. Additionally the design rules require global resources, such as clock resources used by the static areas remain the same when the bit stream is relocated.

20 Claims, 4 Drawing Sheets

DESIGN METHODOLOGY TO SUPPORT RELOCATABLE BIT STREAMS FOR DYNAMIC PARTIAL RECONFIGURATION OF FPGAS TO REDUCE BIT STREAM MEMORY REQUIREMENTS

BACKGROUND

1. Technical Field

The present invention relates to partial reconfiguration of Field Programmable Gate Arrays (FPGAs). More particularly, the present invention relates to a method for dynamic partial reconfiguration to relocate logic performing some functions while logic performing other functions remains static in the FPGA.

2. Related Art

FPGAs supporting dynamic partial reconfiguration are emerging as a standard to support applications that require low power use and have a subset of features or functions to be implemented at any given time. By using FPGAs supporting dynamic partial reconfiguration, a design may be implemented with fewer devices (FPGAs) thus reducing power requirements. For certain applications the designer may wish to implement functions so that they can be moved or reprogrammed into different parts of the device.

For reference, a block diagram of components of a conventional FPGA is shown in FIG. 1. The FPGA includes input/output (I/O) blocks 2 (each labeled 10) located around the perimeter of the FPGA, multi-gigabit transceivers (MGT) 4 interspersed with the I/O blocks 2, configurable logic blocks 6 (each labeled CLB) arranged in an array, block random access memory 8 (each labeled BRAM) interspersed with the CLBs, configuration logic 12, configuration interface 14, on-chip processor 16 and an internal configuration access port (ICAP) 15. The FPGA also includes other elements, such as a programmable interconnect structure (not shown) and a configuration memory array 17. Although FIG. 1 shows a relatively small number of I/O blocks 2, CLBs 6 and block RAMs 8 for illustration purposes, it is understood that an FPGA typically includes many more of these elements.

The FPGA of FIG. 1 is programmed or configured in response to a set of configuration data values that are loaded into a configuration memory array 17 of the FPGA from an external PROM store (not shown) via a configuration interface 14 and configuration logic 12. The configuration interface 14 can be, for example, a parallel select map interface, a JTAG interface, or a master-serial interface. The configuration memory array 17 can be visualized as a rectangular array of bits. The bits are grouped into frames that are one-bit wide words that extend in columns from the top of the array to the bottom. The configuration data values are typically loaded into the configuration memory array one frame at a time from the external store via the configuration interface 14.

More efficient reconfiguration of an FPGA is performed by only rewriting a portion of the frames or columns in the configuration memory array 17 using partial reconfiguration. In one reconfiguration method, the ICAP 15 is used to rewrite data in the configuration memory array 17 in order to generate or instantiate the FPGA's internal logic (e.g., CLBs 6 and BRAMs 8). In other words, one part of the configured FPGA can reconfigure another part of the FPGA. Without using the ICAP 15, reconfiguration can also be performed by loading reconfiguration frames through the configuration interface 14 using external customized logic components to over-write frame data in the configuration memory array 17.

In order to provide for efficient partial reconfiguration, a circuit arrangement shown in FIG. 2 can be provided. To control reading and writing of data into the configuration memory array 17 of an FPGA, a controller 20 is used. The controller 20 can be the ICAP 15 located internal to the FPGA, or alternatively the controller 20 can also be provided outside the FPGA. To mirror data in the configuration memory array 17, configuration store 22 is used. The configuration store 22 is typically a PROM or other non-volatile memory device. The configuration store 22 can speed read and write operations because a bottleneck is otherwise typically created through the configuration interface 14 to the configuration memory array 17. With the configuration store 22 used, data is first modified in the configuration store 22 and later loaded into the configuration memory array 17 through the configuration interface 14 in a frame-by-frame manner.

There are new applications emerging that are power and area sensitive that lend themselves to use FPGA devices supporting partial dynamic configuration. These new applications require that a large set of functions exist in the system and that the FPGA may implement a subset of these functions selectable by the user during operation of the FPGA. The methodology to implement this has been to identify areas on the FPGA to be used as the reconfiguration areas for the designs to be dynamically swapped in and then to implement each of the functions in, the different locations identified.

In one example illustrated in FIG. 3, a design using dynamic reconfiguration includes four areas 51-54 in which any of twenty functions to run at any time are identified. In order to do this the designer would identify the four areas 51-54 on the FPGA and reserve the area for the reconfigurable designs. Then the twenty different functions could be selectively implemented in the areas 51-54. If the designer wanted particular functions to be implemented in the four areas, then the functions could be implemented using the place and route tools into each of the four areas. In this example there are twenty functions and four different physical locations on the device the designer would implement 80 different designs for full cross-location capability. The eighty designs would be used to generate eighty different bit streams for programming and these would be held in PROMs on the product to be used to program the different areas as required.

It would be desirable from a power and PROM use point of view to be able to minimize PROM storage and power required to be able to move functions from one area to another. Significant PROM space is needed to store large portions of the frame data needed to move functions from one FPGA area to another. Likewise, significant power is needed to generate voltages for reprogramming a large number of frame data into the configuration memory.

SUMMARY

Embodiments of the present invention provide for efficient dynamic partial reconfiguration by restricting the implementation of design rules for an FPGA. The design rules are provided to enable a function to be implemented in one area with a single bit stream, where the same single bit stream can be relocated to implement the same function in other areas of the FPGA. In this manner, PROM storage space for the different configurations of a design is significantly reduced. Further, the FPGA design cycle is shortened and significant power savings are provided.

The design rules initially require that the same frames oriented in the same relative location be available in dynamic areas where a bit stream can be located. This can also mean that the same logic resources and the same communication links oriented in the same way are available for the bit stream. In a further rule, the same global resources, such as clock resources, used in static areas remain the same when a bit stream is relocated between dynamic areas. Similarly, any route through from the static areas that goes through the dynamic areas is required to stay the same when relocation of a bit stream occurs.

Under the design rules, a design can be generated according to embodiments of the present invention by initially specifying areas of the FPGA where the relocatable bit stream can be relocated. Next, verification is performed in the areas to assure frame areas oriented in the same relative manner are available to store the bit stream in each area. Next, a list of available resources is generated for each area, the listed resources meeting the following requirements:

(1) entry points of all routing resources listed exist within the boundary area;
(2) at least one exit point of all routing resources listed exists within the boundary of the area;
(3) routing resources listed in different areas provide for the same connectivity within the areas;
(4) routing resources that cross the boundary of an area provide the same timing if timing is a consideration; and
(5) resources used exclusively by static areas remain outside the area boundary.

Once a list is determined, placing and routing of relocatable bit streams can be performed using routing resources listed for the dynamic areas.

BRIEF DESCRIPTION OF THE DRAWINGS

Further details of the present invention are explained with the help of the attached drawings in which.

DETAILED DESCRIPTION

Figure 1:
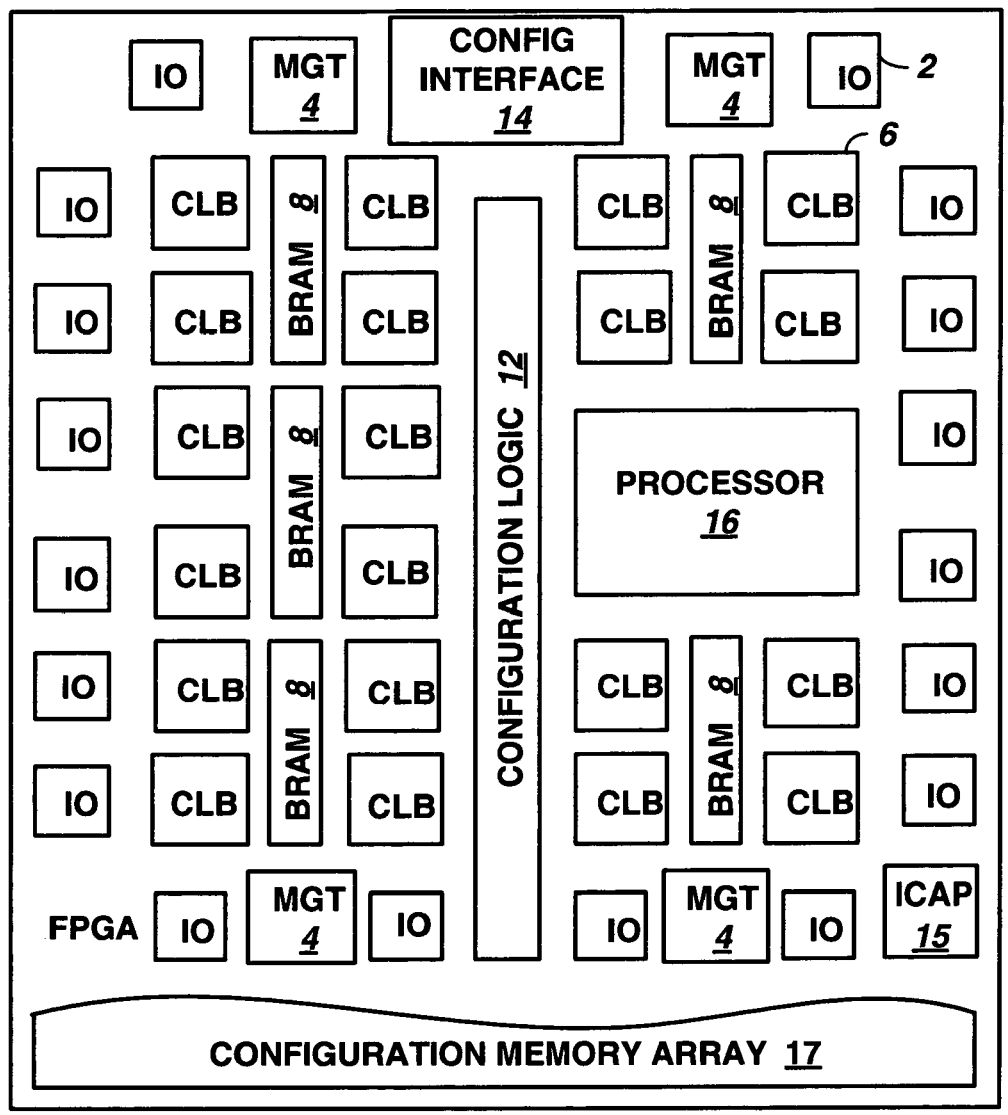
FIG. 1 shows a block diagram of typical components of an FPGA.
Figure 2:
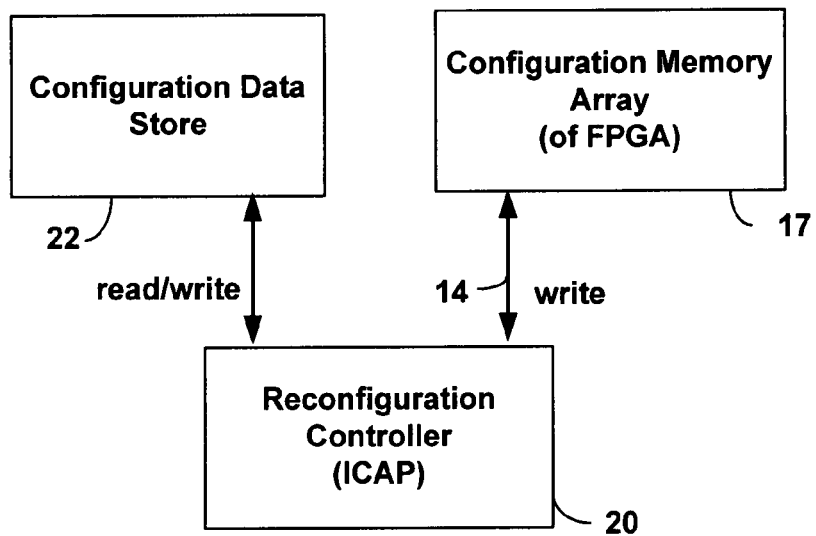
FIG. 2 shows a block diagram of components used with an FPGA to provide for partial reconfiguration.
Figure 3:
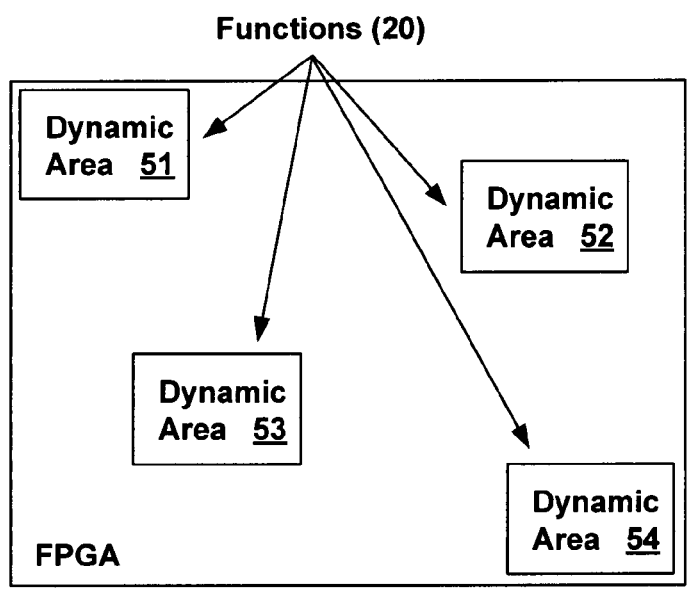
FIG. 3 illustrates dynamic areas defined in an FPGA where functions can be relocated.

There are a number of different forms of dynamic reconfiguration design methodologies. See for example U.S. Pat. No. 6,817,005. Generally all these references define fixed communication resources between the static portions of the design (portion or area programmed in the device at all times) and the dynamic portion (portion or area that can change).

Two references describing specifics of the fixed communication resources between static and dynamic portions of a design are U.S. Pat. No. 6,462,579, and U.S. application Ser. No. 11/126,130, filed May 10, 2005, entitled "Programmabley Configurable Logic-Based Macro", by, Tobias J., Becker, et. al. both of which are incorporated by reference herein in their entirety. These references describe the use of bus macros. The macros guarantee that when reconfiguration happens the communications resource links routing between the dynamic and static portions of the design will remain fixed.

Embodiments of the present invention address a further issue, namely that any global resources that have to either go through the dynamic portions, or global resources that have to be connected up to drive signals directly into the area remain the same length. One example of such a global resource is a clock tree. The clock tree in many cases requires at least the same length of routing into each area, and potentially the same routing orientation within an area, even if the area is relocated. The basic rule here is that any global resource that may need to be used in the dynamic or reconfigured area should be connected up from its source to the entry into the dynamic area in a fixed way, in the same manner that the communication routing between the static and dynamic portions need to remain fixed.

With these two restrictions in mind, rules are imposed to enable relocation of the same single bit stream from one dynamic area of the FPGA to another dynamic area according to embodiments of the present invention. These design rules are described to follow.

As a first rule, the dynamic areas defined by a user should have the same "frame relative" location. "Frame relative" means that the areas must be defined not in terms of pure logic area, but in terms of how the programming frames line up. For a device that has full column height frames, the area defined would be the same exact size, only moved in the horizontal orientation. In a further embodiment, the areas should also have the same exact set of resources (CLBs, Slices, BRAM, . . . ), as defined by programming frames of the column logic. The restriction of having the same resources available in the dynamic areas may be relaxed if the FPGA is built where the row tiles have the same relative bit programming in the frame. For example, if a programming frame covered 16 tiles (CLB tiles for example) and there were 100 bits per tile programming which had exactly the same bit ordering in each tile, it may be possible to align the bits on a tile row boundary verses a frame boundary.

As a second rule, the static to dynamic design communications area routing interfaces should be the exact same relative reources in each area as defined by programming of the resources. This restriction can be satisfied in one embodiment using the macro described in U.S. Pat. No. 6,462,579, as addressed previously herein, or by other means addressed previously.

As a third rule, global resources, such as clocking resources used by the static design portions must have the same relative routing resources. For example, if a third horizontal clock spine is used for one clock network in one area, then that same horizontal resource must be used in every dynamic area that the function can be relocated.

As a fourth rule, general static portion "route-throughs" that are routed through the dynamic areas must be normalized across all target location areas, or bit streams must be dynamically modified. Some design methodologies allow the static design to utilize routing in the dynamic area. This routing is maintained either by ADDing it to the dynamic reconfiguration bit streams or by ORing it in during dynamic reconfiguration. For movable bit streams an ADDing method does not work well, so the ORing method is preferred. Another option is to pre-define route through resources that will be turned on in all areas for the static design implementation. These resources are programmed on in every version of the dynamic reconfiguration bit streams.

As a fourth rule, for any areas that have resources that pose a routing irregularity, those routing resource are removed from a list of available resources. Relocatable bit streams require that every resource used in one area maps directly to a resource that is connected to other resources in the same way in the other area. All routing resources in areas that may be defined in FPGAs do not necessarily follow this rule. This is especially true on the edges where routing resources may turn the corner or even terminate prematurely. In order to allow the bit streams to operate in both areas successfully, it is necessary to screen out all resources that do not exist with the same connectivity from the two areas during implementation of the design. This requires that the user inform the tools of all target destination areas for the function being implemented. According to the target areas, different sets of routing resources may be removed. For example, if an area is at the bottom left of the device and the second area is at the bottom right of the device it may be OK to leave in the bottom edge resources as they exist in both. If we also add an area at the top of the device, we may need to remove both resources at the bottom edge and resources at the top edge.

As a fifth rule, to provide a single relocatable bit stream timing issues resulting from capacitance changes between resources must be resolved. Even though resources are restricted in a dynamic area, there are capacitance issues for resources extending outside of the dynamic area that can affect timing. For example, a hex (6 length) routing resource may be entered on one end and exited at either the center point or the end point. If the entry point and the mid point are both within the reconfiguration area, this part of the resource is allowed to be used by the design (This is only true if all entry points to the resource exist within the boundary). The part that is outside of the area (end half of the line) is not used, but will have a capacitance effect on the part that is used. If this resource capacitance is not the same in two areas then it can have different delay characteristics.

An example of resources that might introduce a significantly different capacitance is a module (or reconfiguration area) that has a column of BRAMs just to its right edge, verses one that does not. A more extreme version of introducing different capacitances would be when an area is bordered by a processor, such as the processor existing in the Virtex-2 Pro FPGA from Xilinx, Inc. of San jose, CA. For the Virtex-2 Pro FPGA, the hexes will continue all the way through the large area of silicon required by the processor so the capacitance associated with the hex resources can be larger even though all routing resources are buffered at their endpoints.

There are several different rules that may be used to resolve capacitance issues. As a first alternative, a rule will disallow resources from being used that extend outside a dynamic area that can have different timing deltas. This may be too restrictive, but is the simplest methodology. As a second alternative, a rule will allow a threshold margin to be specified that will restrict some resources from being used when timing differences exceed the threshold margin. If none of the resources of definable areas will pose timing issues, all resources can be allowed with the user understanding that the timing between dynamic areas will not be exactly the same. If a user then believes it is necessary, the design can be separately analyzed for timing.

With the above rules providing a base line, a design for a single relocatable bit stream can be provided. The steps for creating such a design are illustrated in the flow chart of FIG. 4, and described to follow.

As a first step 102, the designer generates design pieces and specifies areas (A, B, C, . . . ) to be used for a reolcatable bit stream. In a second step 104, the system or tool verifies that the areas and interfaces to the areas are good for the function to be implemented by assuring the same relative frame area is available with the same logic pattern and relative communication links. In a third step 106, the system or tool analyzes the routing resources in the dynamic areas to generate a list of available resources allowable for the areas. The steps for determining the list are shown in FIG. 5.

Figure 5:
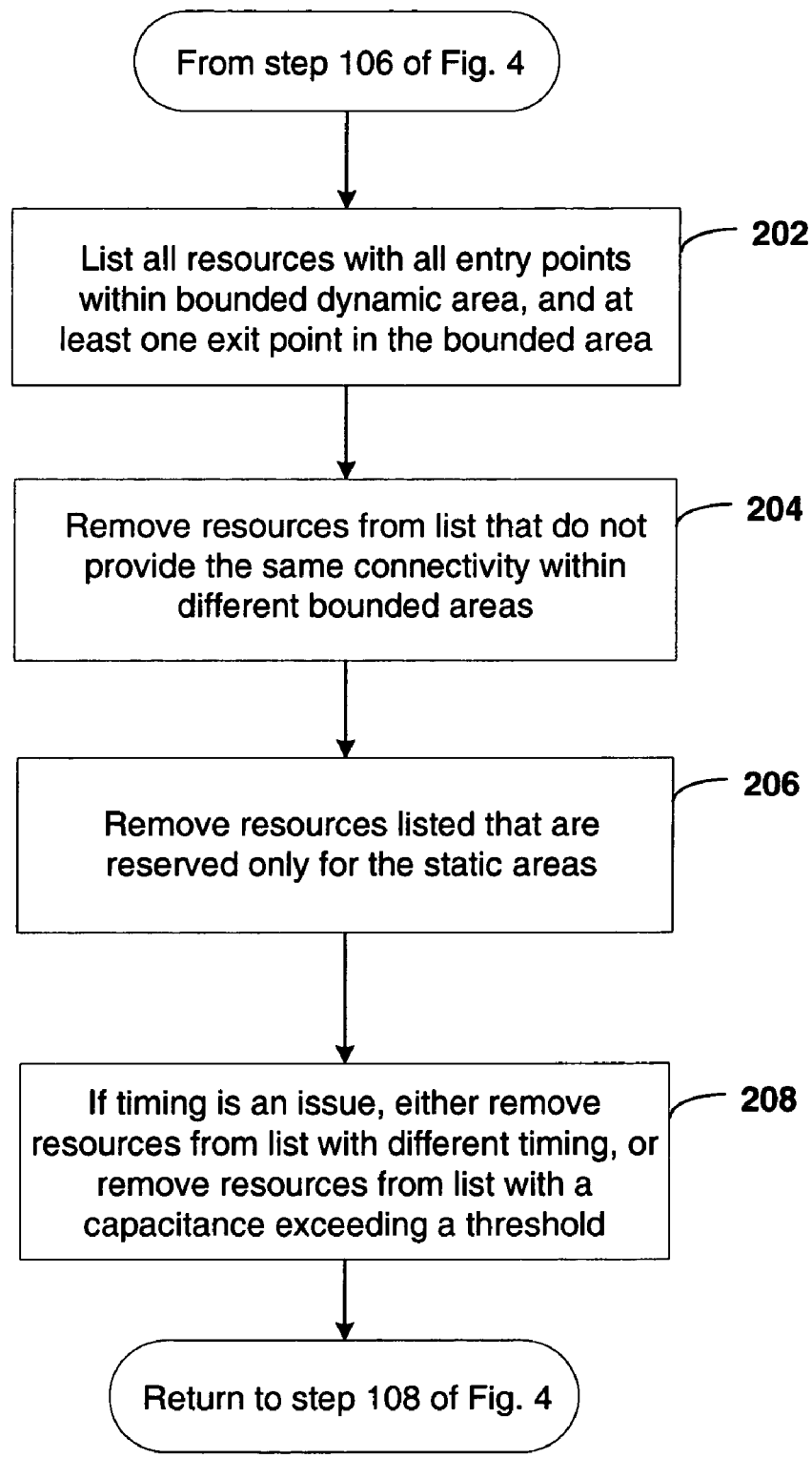
FIG. 5 is a flow chart illustrating steps for generating a list of available resources for step 106 of FIG. 4.

Referring to FIG. 5, in a first step 202 for determining resources list entry points are analyzed. To make the list in step 202 a resource is required to have all entry points existing within the area boundary and that at least one exit point that exists within the area. Exit points of resources existing outside of the area are allowed, but are not permitted to be used during routing. In a step 204, resources are removed from the list that do not exist in both the current target area and all other areas to be targeted with exactly the same connectivity. In a further step 206, any resources that are reserved for the static design in any of the dynamic areas are removed from the list.

In step 208, if timing is a consideration one of several rules or constraints are imposed. In one rule, resources that provide routing with different timing are removed. In an alternative rule for step 208, a determination is made if a timing exceeds a threshold for a resource, and if its capacitance caused it to exceed a threshold the resource is removed from the list.

Figure 4:
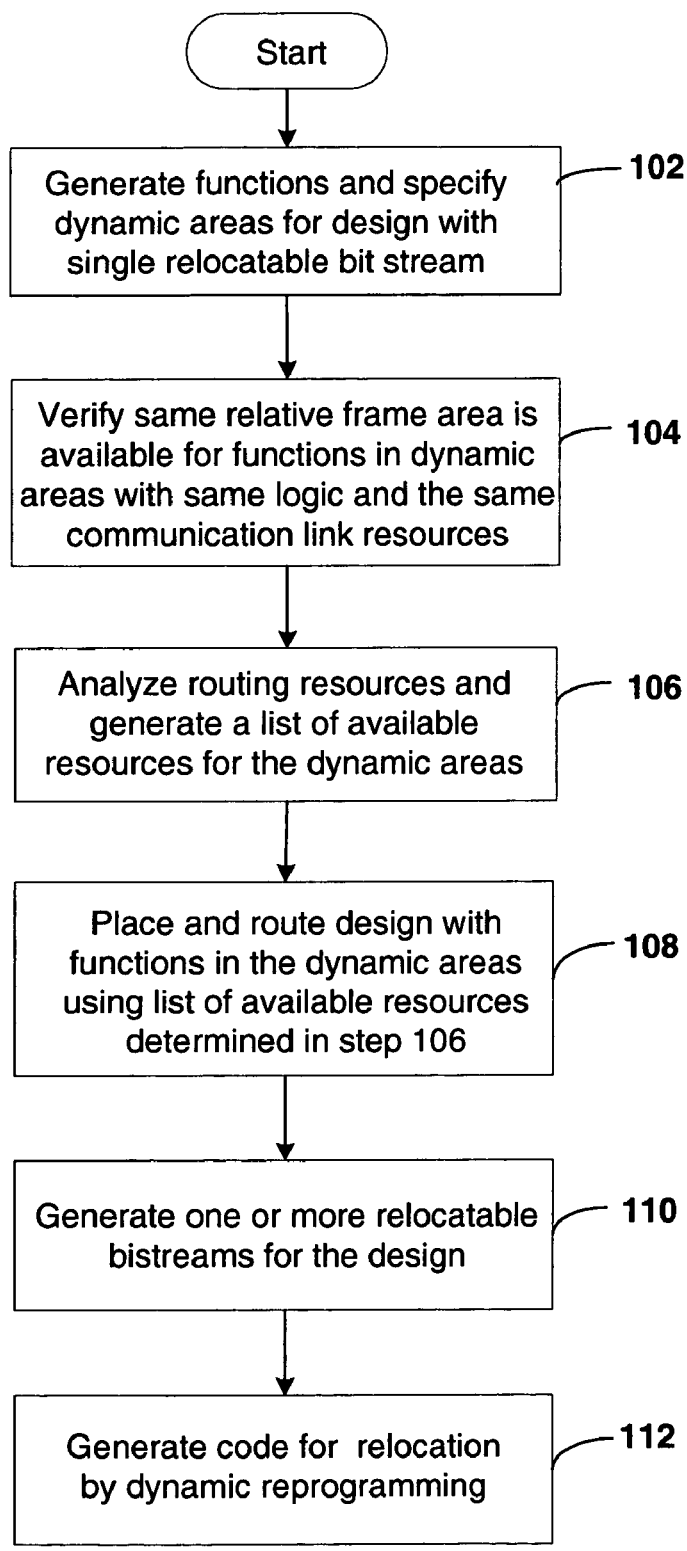
FIG. 4 is a flow chart illustrating steps for creating of a design with at least one relocatable bit stream.

Once the list has been created from the steps of FIG. 5, we return to step 108 of FIG. 4. In step 108 of, a designer places and routes a design with functions in the dynamic area using the resources available in the list generated in step 106. In one embodiment, a user may request generation of a design that includes moving a function to all dynamic areas it will be placed. A design that allows movement of a function to all areas allows for timing verification of the design.

Once a design is complete, in a step 110 one or more bit streams for the design are generated. In a final step 112, information for relocation by dynamic reprogramming, or bit stream morphing code is generated. Implementation of morphing code can be done in one of many different ways, such as that described in U.S. Pat. No. 6,817,005, as explained above.

Although the present invention has been described above with particularity, this was merely to teach one of ordinary skill in the art how to make and use the invention. Many additional modifications will fall within the scope of the invention, as that scope is defined by the following claims.

The invention claimed is:

1. A method for generating a design for an FPGA, the design being partially reconfigurable by allowing for at least one relocatable bit stream, the method comprising:
   specifying given areas of the FPGA where the relocatable bit stream module can be located;
   verifying that a same relative frame area is available for storing the relocatable bit stream in each of the given areas;
   generating a list of routing resources available for the relocatable bit stream within each of the given areas, wherein the list has the following parameters:
      requiring that all entry points to each routing resource listed for a given area exist within a boundary of the given area,
      requiring that at least one exit point on each routing resource listed for a given area exists within the given area,
      requiring all the routing resources listed for each of the given areas provide the same connectivity,
      allowing routing resources that cross a boundary of a given area to be included on the list when an entry point and at least one exit point of the routing resource are located within the given area,
      excluding each routing resource from the list of routing resources that does not map directly to another routing resource having same connectivity within each of the given areas; and
   placing and routing the relocatable bit stream using the routing resources listed, wherein when a routing resource that crosses a boundary of a given area is used, the entry point and the exit point of the routing resource are located within the given area.

2. The method of claim 1, further comprising:
verifying that the frame areas are available in a same orientation in each of the given areas.

3. The method of claim 1, further comprising:
verifying that resources available for use by the bit stream in each of the given areas are the same.

4. The method of claim 1, further comprising:
verifying that communication links available for use by the bit stream in each of the given areas are the same.

5. The method of claim 1, wherein the step of generating a list of routing resources has the following additional parameter:
requiring that all the listed routing resources that cross the boundary of one of the given areas provide a time delay within a threshold margin of one another.

6. The method of claim 1, wherein the step of generating a list of routing resources has the following additional parameter:
requiring all the listed routing resources provide a maximum capacitance.

7. The method of claim 1, wherein the step of generating a list of routing resources has the following additional parameter:
requiring routing resources used only for a static design to remain outside the listed routing resources.

8. A method for generating a design for an FPGA, the design being partially reconfigurable, wherein the FPGA includes physical areas with resources to support portions of a design, wherein the portions include dynamic portions that are programmed with a relocatable bit stream implementing a given function, as well as static portions, the method comprising:
providing a design rule that frames required to store the relocatable bit stream in the configuration memory for the given function are provided in each of the dynamic portions where the function will be stored;
providing a design rule that communications interface resources linking from the static portions to the dynamic portions, when the relocatable bit stream is relocated, remains the same in each of the dynamic portions;
providing a design rule that global resources used by the static portions remain the same through the dynamic portions, when the relocatable bit stream is relocated to each of the dynamic portions;
generating a list of routing resources available for the relocatable bit stream within each of the dynamic portions;
including routing resources that cross a boundary of a dynamic portion on the list when an entry point and at least one exit point of the routing resource are located within the dynamic portion; and
excluding each routing resource from the list of routing resources that does not map directly to another routing resource having same connectivity within each of the dynamic portions.

9. The method of claim 8, further comprising:
providing a design rule limiting logic resources used by the relocatable bit stream to same relative resources in each of the dynamic portions where the relocatable bit stream will be stored.

10. The method of claim 8, further comprising:
providing a design rule that the frames provided to store the relocatable bit stream in each dynamic portion are oriented the same.

11. The method of claim 8, wherein the global resources comprise clocking resources.

12. The method of claim 8, further comprising:
providing a design rule that route throughs for the static portions provided through the dynamic portions will be performed by at least one of ADDing or ORing the routing with a bit stream for the given function when the bit stream is stored in each of the dynamic portions.

13. The method of claim 8, further comprising:
providing a design rule that all routing resources in the dynamic portions that cross the boundary of one of the static portions provide a time delay within a threshold margin of one another.

14. The method of claim 8, further comprising:
providing a design rule requiring all routing resources used by the relocatable bit stream have a capacitance less than a threshold value.

15. A method for generating design parameters for an FPGA, the design being partially reconfigurable by allowing for at least one relocatable bit stream, the method comprising:
specifying given areas of the FPGA where the relocatable bit stream module can be located;
verifying that a frame area available for storing the bit stream in each of the given areas is the same;
prior to placement and routing of the relocatable bit stream, generating a list of routing resources available for the relocatable bit stream within each of the given areas, wherein routing resources in the list have at least one entry point within a boundary of the given areas;
including routing resources that cross a boundary of a given area on the list when an entry point and at least one exit point of the routing resource are located within the given area; and
excluding each routing resource from the list of routing resources that does not map directly to another routing resource having same connectivity within each of the given areas.

16. The method of claim 15, wherein the routed resources listed for each of the areas provide the same connections.

17. The method of claim 15, wherein the routed resources listed within the given areas have at least one exit point within a boundary of the given areas.

18. The method of claim 1, wherein the step of generating a list of routing resources has the following additional parameter:
requiring that all the listed routing resources that cross the boundary of one of the given areas provide the same time delay, as determined, at least in part, with respect to a portion of the routing resource extending beyond the boundary.

19. The method of claim 1, wherein the step of generating a list of routing resources has the following additional parameter:
requiring all the listed routing resources provide a maximum capacitance, as determined, at least in part, with respect to a circuit element external to the given area.

20. The method of claim 1, wherein at least one of the given areas is a rectangle having a length that is less than a column of logic within the FPGA and a width that is less than a row of tiles within the FPGA.

* * * * *